(12) United States Patent
Furusawa et al.

(10) Patent No.: US 6,780,465 B2
(45) Date of Patent: Aug. 24, 2004

(54) METHOD FOR MAKING THIN FILM AND ELECTRONIC APPARATUS

(75) Inventors: Masahiro Furusawa, Suwa (JP); Tatsuya Shimoda, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 184 days.

(21) Appl. No.: 10/026,635

(22) Filed: Dec. 27, 2001

(65) Prior Publication Data

US 2002/0114887 A1 Aug. 22, 2002

(30) Foreign Application Priority Data

Dec. 28, 2000 (JP) ........................................ 2000-403229

(51) Int. Cl.[7] .............................................. C23C 16/04
(52) U.S. Cl. .............................. 427/248.1; 427/255.33; 427/256; 427/299; 427/300
(58) Field of Search .......................... 427/248.1, 255.23, 427/256–288, 299, 300

(56) References Cited

U.S. PATENT DOCUMENTS 4,746,548 A * 5/1988 Boudreau et al. ........ 427/248.1
5,383,970 A * 1/1995 Asaba et al. ................ 118/726

FOREIGN PATENT DOCUMENTS

JP    A-2000-12465    1/2000
JP    2000012465 A * 1/2000    ........ H01L/21/205

OTHER PUBLICATIONS

Ulman, Abraham, Part Three "Self–Assembled Monolayers" of *An Introduction to Ultrathin Organic Films From Langmuir–Blodgett to Self–Assembly*, (Academic Press Inc., Boston, 1991), pp. 237–304.

* cited by examiner

Primary Examiner—Timothy Meeks
(74) Attorney, Agent, or Firm—Oliff & Berridge, PLC

(57) ABSTRACT

The present invention provides a method for forming a thin film using a CVD process in which a large-scale vacuum exhaust unit or neutralization unit is not required, and a patterning step after the formation of the film is not required. A pattern formed of a monolayer is formed using (heptadecafluoro-1,1,2,2-tetrahydro)decyl-triethoxysilane on a surface to form a thin film of a second glass substrate. Droplets formed of trimethylaluminum are placed on a plurality of parts of an upper surface of a first substrate. The droplets are placed at the positions corresponding to openings of the monolayer pattern. Both substrates are placed in parallel with a predetermined distance therebetween, and the openings and the droplets are aligned with each other. While supplying nitrogen gas between the substrates, the second substrate is heated to 300° C. and retained for 5 minutes. Thereby, the droplets are vaporized and the gas is fed into the openings. Aluminum resulting from decomposition by heat is deposited in these parts and aluminum thin films are formed.

9 Claims, 6 Drawing Sheets (a)

(b)

(c)

(d)

(a)

(b)

(c)

(d)

(a)

(b)

(c)

(d)

(e)

METHOD FOR MAKING THIN FILM AND ELECTRONIC APPARATUS

BACKGROUND OF THE INVENTION

1. Field of Invention

The present invention relates to methods for making thin film patterns using chemical vapor deposition (CVD).

2. Description of Related Art

In chemical vapor deposition (CVD), the material for the thin film is fed in a gaseous form to a substrate, and the gas is decomposed by heat, light, etc., so that a desired thin film is deposited on or over the substrate. This process is widely used as a method for making thin films, for example, semiconductor films, insulating films, and conductive films, in the process of manufacturing semiconductor apparatus. In the CVD process, a vaporized substance that is obtained by vaporizing a liquid may be used as a raw material. The CVD process using organometallic compounds is particularly referred to as "metal organic chemical vapor deposition" (MOCVD). In general, the gaseous materials and the vaporized substances of liquid materials are produced outside of a reaction chamber and are introduced into the reaction chamber via pipes.

In the process of manufacturing semiconductor apparatus, after a thin film is formed over the entire surface of a substrate, a patterning step is performed in which unnecessary parts are removed, leaving necessary parts of the thin film. The patterning step is usually performed as follows. First, a resist film is formed on the thin film, and the resist film is then irradiated with light through a photomask to form a resist pattern. Unnecessary parts of the thin film are then removed by etching using the resist pattern as a mask. Next, the resist pattern is removed.

Additionally, since CVD deposition is accompanied with a chemical reaction, it is also possible to only form a thin film in necessary regions (selective growth) by bringing about an inactive state in regions in which the thin film is unnecessary on the substrate.

However, in the conventional CVD and MOCVD processes, since hazardous gases which are highly reactive are introduced into a reaction chamber, leakage of the gases from the reaction chamber must be prevented during reaction, and the gases must be reliably recovered after the reaction. For this purpose, in a conventional CVD system and MOCVD system, large-scale vacuum exhaust units are provided. A portion of the gas introduced into the reaction chamber is subjected to reaction to form a thin film, and most of the gas must be recovered and neutralized.

As described above, since a method for making thin films using the conventional CVD process requires a large-scale vacuum exhaust unit or neutralization unit, there is room for a reduction in costs.

In particular, with respect to large liquid crystal displays, etc., an array of switching elements for corresponding pixels must be formed on a large area substrate, and if the array is formed by the conventional method (in which the patterning step is performed after the thin film is formed over the entire surface of the substrate), the amount of the thin film that is left on the substrate is significantly small, and most of the thin film is removed in the patterning step.

Additionally, even where the thin film is selectively grown using a CVD process, under the existing conditions, a step is required in which portions protruding from the pattern of the thin film are removed. That is, although the amount of the thin film to be removed can be decreased by selectively growing the thin film using the CVD process, even in such a case, it is still necessary to remove the unnecessary thin film after the thin film is formed.

As described above, in the method for producing large liquid crystal displays, etc., using the method for forming thin films using the conventional CVD process, the raw materials for the thin films are wasted, which is disadvantageous.

On the other hand, Japanese Unexamined Patent Application Publication No. 2000-12465 discloses a method for simultaneously forming silicon films on both film formation surfaces of a first member for forming the silicon film and a second member for forming the silicon film. In this method, the first member for forming the silicon film, in which a liquid raw material is applied on the film formation surface, and the second member for forming the silicon film are placed so as to face each other.

In accordance with this method, a silicon film is formed on the film formation surface of the first member for forming the silicon film by a decomposition reaction of the liquid raw material applied, and a silicon film is formed on the film formation surface of the second member for forming the silicon film by a decomposition reaction of a vaporized substance from the liquid raw material on the film formation surface of the first member for forming the silicon film. According to this publication, the simultaneous formation of silicon films on two substrates, and the formation of the silicon film with a uniform thickness over the entire surface of the second member for forming the silicon film, are mentioned as advantages of the invention.

However, in the method according to this publication, a patterning step must also be performed after the formation of the thin films in order to obtain a silicon thin film with a predetermined pattern.

SUMMARY OF THE INVENTION

The present invention addresses the problems associated with the conventional techniques described above. Thus, the present invention provides a method for forming a thin film using a CVD process in which a large-scale vacuum exhaust unit or neutralization unit is not required, and the thin film can be formed partially on a substrate using a small amount of raw material liquid. The invention also provides a method in which a thin film pattern is obtained, even without performing a patterning step after the formation of the thin film.

In order to address the problems described above, the present invention provides a method for forming a thin film using chemical vapor deposition, in which a liquid containing a raw material for the thin film is placed on a part or a plurality of parts of a substrate, and the raw material for the thin film is vaporized from the liquid so as to be fed to a part or a plurality of parts of the surface for forming the thin film, and thereby the thin film is formed with a predetermined pattern on the surface for forming the thin film.

In one aspect of the present invention, a method for forming a thin film by chemical vapor deposition includes the steps of: placing a liquid containing a raw material for the thin film on a part or a plurality of parts of a substrate; and vaporizing the raw material for the thin film from the liquid so as to be fed to a part or a plurality of parts of the surface for forming the thin film to form the thin film with a predetermined pattern on the surface for forming the thin film.

In accordance with this method, even where a thin film pattern in which a thin film is present on a significantly small part of a large area substrate is formed, the amount of the raw material for the thin film to be used can be significantly decreased. Additionally, since it is not necessary to introduce the raw material for the thin film in the gaseous state into a reaction chamber, a large-scale vacuum exhaust unit or neutralization unit is not required.

Examples to perform such a method are described below.

(1) In the method for forming the thin film, one surface of the substrate is used as a surface to place the liquid, and the thin film is formed in a region other than the region in which the liquid is placed on the surface to place the liquid.

In accordance with the method described above, by only using a substrate to form a thin film, without using a dummy substrate to place a liquid, it is possible to form a thin film pattern on the substrate.

(2) In the method for forming the thin film, a first substrate to place the liquid and a second substrate to form the thin film are placed so that the surface to place the liquid of the first substrate faces the surface to form the thin film of the second substrate, and the raw material for the thin film is vaporized from the liquid placed on a part or a plurality of parts of the first substrate so as to be fed to the surface to form the thin film of the second substrate.

Consequently, the thin film pattern can be formed on a part or parts of the surface to form the thin film of the second substrate facing the part or parts of the first substrate to place the liquid.

(3) In the method for forming the thin film, preferably, the surface to form the thin film of the second substrate is heated to a temperature at which a vaporized substance of the raw material for the thin film is decomposable, and the first substrate is heated to a temperature at which the raw material for the thin film is vaporized from the liquid by the heat radiated from the second substrate.

Consequently, the costs associated with the method using two substrates can be reduced.

(4) In the method for forming the thin film, before the step of placing the liquid, an active region and an inactive region for the chemical vapor deposition are formed in the surface to form the thin film so that the thin film is selectively deposited.

(5) In the method for forming the thin film, the formation of the active region and the inactive region for the chemical vapor deposition is performed by forming a self-assembled film on the surface to form the thin film having hydroxyl groups using a silane derivative represented by the general formula $RSiX_3$ (where R is a fluoroalkyl group in which terminal hydrogen of the alkyl group is replaced with fluorine, and X is an alkoxy group or halogen group); and performing ultraviolet irradiation on the self-assembled film through a photomask or performing electron beam irradiation on necessary parts of the self-assembled film so that the self-assembled film in a region to form the active region for the chemical vapor deposition is removed.

Consequently, since the thin film pattern is obtained simultaneously with the formation of the thin film, a patterning step is not required after the formation of the thin film.

In the present invention, the "self-assembled film" is a monolayer formed by making a compound, in which functional groups that are capable of linking to constituent atoms of a surface to form a film are combined with straight chain molecules, coexist in the gaseous or liquid state with the surface to form the film so that the functional groups are adsorbed on the surface to form the film to link to the constituent atoms, the straight chain molecules being directed outward. Since the monolayer is formed by spontaneous chemisorption of the compound to the surface to form the film, it is referred to as "a self-assembled film."

Additionally, the self-assembled film is described in detail in Chapter 3 of A. Ulman, "An Introduction to Ultrathin Organic Film from Langmuir-Blodgett to Self-Assembly" (Academic Press Inc., Boston, 1991).

Where the gaseous or liquid silane derivative ($RSiX_3$) is made to coexist with the surface to form the thin film in which hydroxyl groups are present, first, X is hydrolyzed by the moisture in the air to form a fluoroalkylsilanol ($RSi(OH)_3$). Siloxane bonds are formed due to the dehydration reaction between the hydroxyl groups of the silanol anid the hydioxyl groups of the surface to form the film, and a monolayer (self-assembled film) in which the fluoroalkyl groups (R) are directed outward is formed on the surface to form the film. The surface of the self-assembled film is in an inactive state (with low surface energy and low reactivity) due to the presence of the fluoroalkyl groups.

Preferred examples of the silane derivative represented by the general formula $RSiX_3$ are fluoroalkylalkoxysilanes, such as (heptadecafluoro-1,1,2,2-tetrahydro)decyl-triethoxysilane, (heptadecafluoro-1,1,2,2-tetrahydro)decyl-trimethoxysilane, (tridecafluoro-1,1,2,2-tetrahydro)octyl-trimethoxysilane, and (tridecafluoro-1,1,2,2-tetrahydro) octyl-triethoxysilane).

Accordingly, the portion of the surface to form the thin film, in which the self-assembled film is removed by the method described above, becomes an active region for the chemical vapor deposition, and the portion of the surface to form the thin film, in which the self-assembled film remains, becomes an inactive region for the chemical vapor deposition.

(6) In the method for forming the thin film, the step of vaporizing the raw material for the thin film is performed while supplying inert gas, hydrogen gas, or a mixture of inert gas and hydrogen gas parallel to the surface to place the liquid of the substrate.

Consequently, where a liquid is placed on the surface of the substrate to form the thin film, the vaporized substance from the liquid placed can be easily scattered in the vicinity of the position in which the liquid is placed. In the case that two substrates are used and the vaporized substance from the liquid placed on the first substrate is sent to the second substrate, it is possible to control the amount of the vaporized substance to be sent to the second substrate. Thereby, the thickness of the thin film to be formed can be controlled.

(7) In the method for forming the thin film, preferably, the step of placing the liquid is performed by an ink-jet method. As the liquid (liquid containing the raw material for the thin film) used in the method of the present invention, any liquid is acceptable as long as the raw material for the thin film is vaporized. Known liquid materials (e.g., liquid organometallic compounds and liquid silane compounds) which are used in a CVD or MOCVD process in general may be used.

Specific examples of organometallic compounds include trimethylaluminum, trimethylgallium, trimethylphosphine, and triethylaluminum. Specific examples of silane compounds include hydrogenated silane compounds, such as trisilane, tetrasilane, pentasilane, and hexasilane; halogenated silane compounds, such as tetrachlorosilane and trichlorosilane; the fluoroalkylalkoxysilanes; silane coupling agents represented by the general formula $R_nSiX_{(4-n)}$; and tetraethoxysilane (TEOS).

In the methods of the present invention, as substrates (the substrate on which both the placement of the liquid and the formation of the thin film are performed, the first substrate on which only the placement of the liquid is performed, and the second substrate on which only the formation of the thin film is performed), silicon (Si) wafers, quartz plates, glass plates, plastic films, metal plates, or the like may be used. Such substrates on which semiconductor films, metal films, dielectric films, organic films, etc., are deposited may be used as substrates.

(8) In an electronic apparatus, thin films that are formed by any one of the methods for forming thin films described above can be used as electrodes.

DETAILED DESCRIPTION OF PREFERRED EMBODIMENTS

The embodiments of the present invention will now be described with reference to the drawings.

A first embodiment of the method of the present invention will be described with reference to FIGS. 1(a)–1(d).

Figure 1:
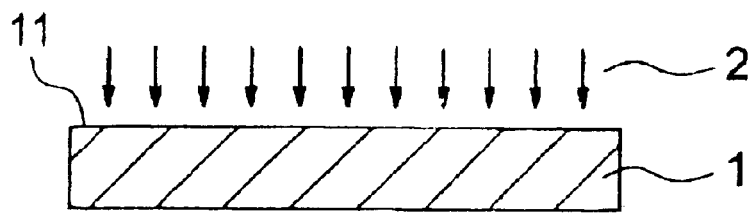
FIGS. 1(a)–1(d) are schematics illustrating a method in a first embodiment of the present invention.
Figure 1:
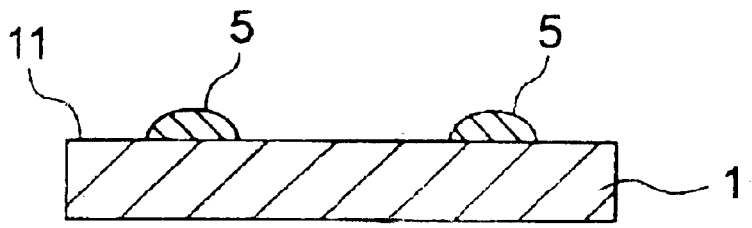
Figure 1:
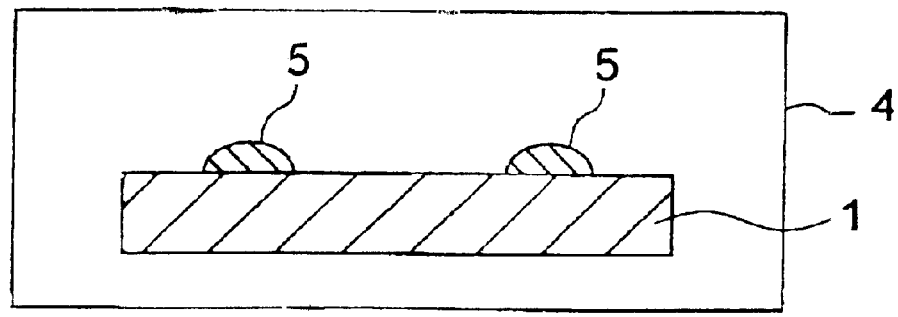
Figure 1:
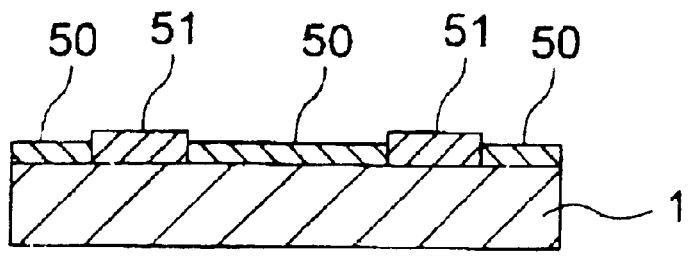
Figure 2:
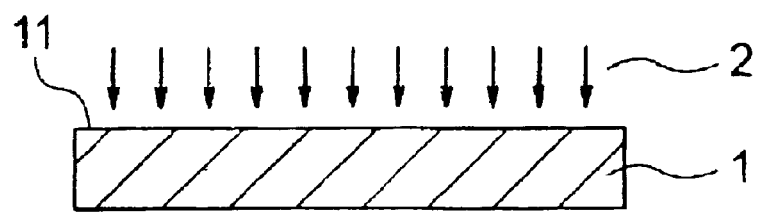
FIGS. 2(a)–2(d) are schematics illustrating a method for forming a monolayer (self-assembled film) performed in second and third embodiments of the present invention.
Figure 2:
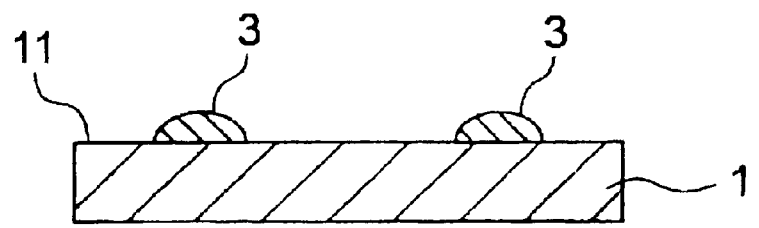
Figure 2:
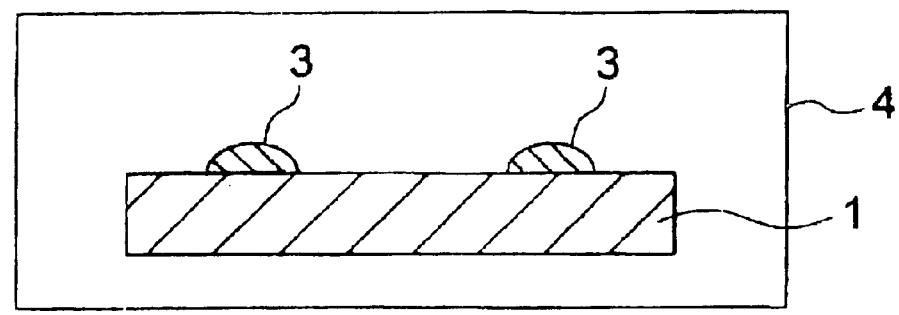
Figure 2:
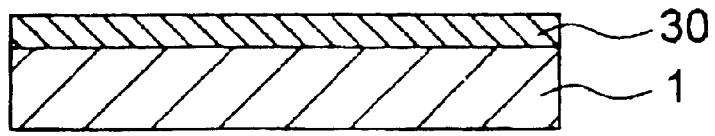
Figure 3:
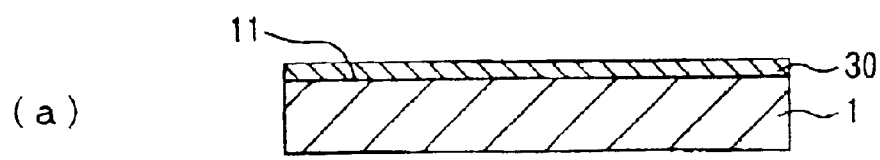
FIGS. 3(a)–3(e) are schematics illustrating a method in the second embodiment of the present invention.
Figure 3:
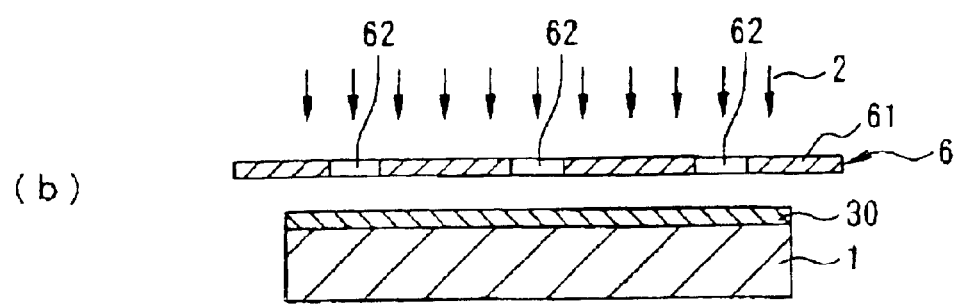
Figure 3:
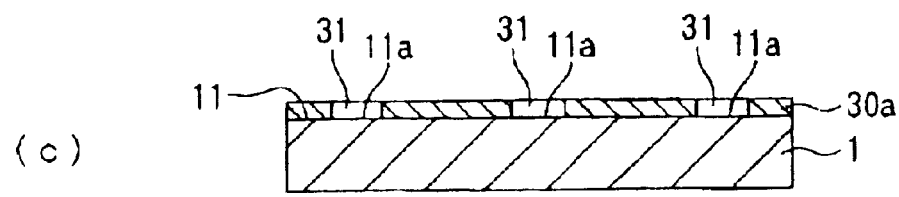
Figure 3:
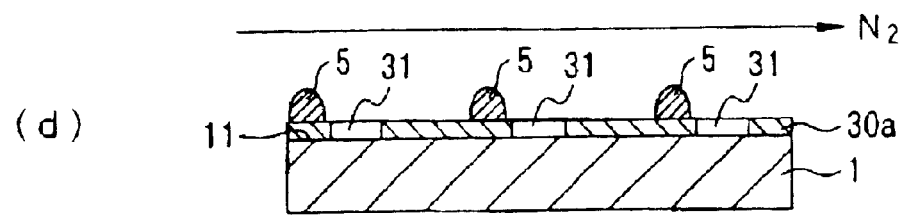
Figure 3:
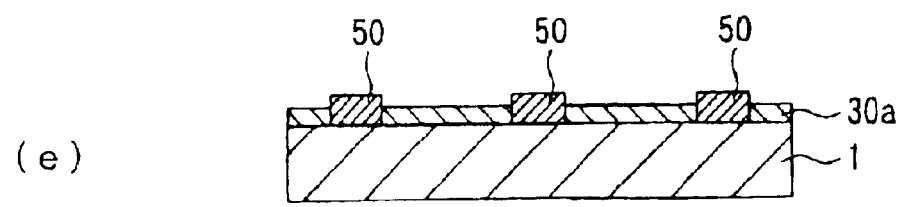

First, as shown in FIG. 1(a), a surface 11 to form a thin film of a glass substrate 1 was irradiated with ultraviolet light 2 to clean the surface 11 to form the thin film. Thereby, the surface 11 to form the thin film of the glass substrate 1 has a state in which hydroxyl groups are present over the entire surface. The ultraviolet irradiation was performed under the following conditions. That is, the wavelength of the ultraviolet light was 172 nm, the ultraviolet intensity was 10 mW/cm$^2$, and the irradiation period was 10 minutes.

Next, as shown in FIG. 1(b), in a nitrogen atmosphere, by ejecting liquid trimethylaluminum, using an ink-jet method, to a plurality of parts in the surface 11 to form the thin film of the glass substrate 1, droplets 5 were placed. In this case, droplets 3 with a diameter of 50 µm were placed in a lattice shape with a spacing of 100 µm.

Next, as shown in FIG. 1(c), the glass substrate 1 was placed in a hermetically sealed container 4 in which nitrogen gas was filled, and was left to stand for 10 minutes, while retaining the temperature of the hermetically sealed container 4 at 200° C. to vaporize the droplets 5 formed of trimethylaluminum. Thereby, the droplets 5 were partially vaporized to form gaseous trimethylaluminum, which was fed to the parts of the surface 11 to form the thin film in which the droplets 5 were not placed. The gas was decomposed by heat, and aluminum was deposited on the parts in which the droplets 5 were not placed. As shown in FIG. 1(d), an aluminum thin film 50 was thereby formed. The aluminum thin film 50 had a thickness of 30 nm.

Additionally, in the parts of the surface 11 to form the thin film in which the droplets 5 were placed, unvaporized trimethylaluminum was pyrolyzed to form aluminum thick films 51 with a thickness of approximately 100 nm. The aluminum thick films 51 were of poor quality, and the adhesion thereof to the substrate was weak, and therefore, the aluminum thick films 51 were immediately separated from the surface 11 to form the thin film. As a result, the aluminum thin film 50 was formed in a pattern with openings corresponding to the parts in which the thick films 51 had been present.

A second embodiment of the method of the present invention will be described with reference to FIGS. 2(a)–3(e).

First, as shown in FIG. 2(a), a surface 11 to form a thin film of a glass substrate 1 was irradiated with ultraviolet light 2 to clean the surface 11 to form the thin film. The ultraviolet irradiation was performed under the following conditions. That is, the wavelength of the ultraviolet light was 172 nm, the ultraviolet intensity was 10 mW/cm$^2$, and the irradiation period was 10 minutes. Thereby, the surface 11 to form the thin film of the glass substrate 1 has a state in which hydroxyl groups are present over the entire surface.

Next, as shown in FIG. 2(b), by ejecting liquid (heptadecafluoro-1,1,2,2-tetrahydro)decyl-triethoxysilane (hereinafter referred to as "FAS17"), using an ink-jet method, to a plurality of parts in the surface 11 to form the thin film of the glass substrate 1, droplets 3 were placed. The droplets 3 with a diameter of 50 µm were placed in a lattice shape with a spacing of 1 mm. The chemical formula (rational formula) of FAS17 is $CF_3(CF_2)_7(CH_2)_2Si(OC_2H_5)_3$.

Next, as shown in FIG. 2(c), the glass substrate 1 was placed in a hermetically sealed container 4, and was left to stand for 1 hour while retaining the temperature of the hermetically sealed container 4 at 100° C. to vaporize the droplets 3 formed of FAS17. Thereby, the droplets 3 were entirely vaporized, and the vaporized substance was fed to the entire surface 11 to form the thin film of the glass substrate 1.

As a result, as shown in FIGS. 2(d) and 3(a), siloxane bonds were formed due to the dehydration reaction between the hydroxyl groups of the silanol formed by the hydrolysis of the ethoxy groups of FAS17 and the hydroxyl groups of the surface 11 to form the thin film of the glass substrate 1, and thereby a monolayer (self-assembled film) 30 in which fluoroalkyl groups ($CF_3(CF_2)_7(CH_2)_2$—) were directed outward was formed over the entire surface 11 to form the thin film of the glass substrate 1. The surface of the monolayer 30 is inactive for chemical vapor deposition due to the presence of the fluoroalkyl groups.

Next, as shown in FIG. 3(b), a photomask 6 in which ultraviolet shading sections 61 were formed in a lattice shape and which had rectangular ultraviolet transmitting sections 62 was prepared, and the monolayer 30 was irradiated with ultraviolet light 2 through the photomask 6. Thereby, the parts of the monolayer 30 placed beneath the ultraviolet transmitting sections 62 were removed, and a monolayer pattern 30a having many rectangular openings 31 was formed in a lattice shape on the surface 11 to form the thin film of the glass substrate 1. FIG. 3(c) shows such a state.

The ultraviolet irradiation was performed under the following conditions. That is, the wavelength of the ultraviolet light was 172 nm, the ultraviolet intensity was 10 mW/cm$^2$, and the irradiation period was 15 minutes. The size of the rectangle of the ultraviolet transmitting section 62 of the photomask was 10 µm×50 µm, and the ultraviolet transmitting sections 62 were arrayed with a spacing of 500 µm.

The openings 31 of the monolayer pattern 30a expose the surface 11 to form the thin film of the glass substrate 1. In the exposed surfaces 11a, hydroxyl groups are present, and the exposed surfaces 11a are active for chemical vapor deposition. The sections of the surface 11 to form the thin film in which the monolayer remains (i.e., the surface of the monolayer pattern 30a) are inactive for chemical vapor deposition. Therefore, active regions and inactive regions for chemical vapor deposition were formed in the surface 11 to form the thin film of the glass substrate 1 by the monolayer pattern 30a.

Next, as shown in FIG. 3(d), in a nitrogen atmosphere, liquid trimethylaluminum was ejected by an ink-jet method to the vicinity of each opening 31 on the surface of the monolayer pattern 30a (monolayer-remaining section), one by one, so as to correspond to each opening 31, and droplets 5 with a diameter of 50 μm were arrayed. Each droplet 5 was placed at a distance of 50 μm from the short side of the rectangle of each opening 31 (the short side on the same side of each opening 31, i.e., as shown in FIG. 3(d), the short side on the left side of the opening 31).

Next, in this state, the glass substrate 1 was heated to 150° C. and retained for 10 minutes, while supplying nitrogen gas parallel to the surface 11 to form the thin film (i.e., the surface for placing the liquid) of the glass substrate 1 in the direction from the droplet 5 to the adjacent opening 31 (as shown by an arrow, from left to right in FIG. 3(d)) to vaporize the droplets 5 composed of trimethylaluminum.

Consequently, the droplets 5 were entirely vaporized to form gaseous trimethylaluminum, which were fed into the respective openings 31 (openings on the right side of the droplets 5 in FIG. 3(d)). The gas was decomposed by heat, and aluminum thin film 50 was formed in the respective openings 31. The aluminum thin film 50 was not formed on the surface of the monolayer pattern 30a (monolayer-remaining section). The aluminum thin film 50 had a thickness of 10 nm. Thereby, the aluminum thin film 50 was formed in a pattern in which rectangles were arrayed at positions corresponding to all the openings 31 of the monolayer pattern 30a.

A third embodiment of the method of the present invention will be described with reference to FIGS. 4(a)–4(c).

Two glass substrates 7 and 8 were prepared, and first, a pattern 30a formed of a monolayer (self-assembled film) was formed using FAS17 on a surface 71 to form a thin film of the glass substrate (second substrate) 7 by the method in accordance with the second embodiment.

Next, droplets 5 were placed on a plurality of parts of an upper surface (surface for placing liquid) 81 of the other glass substrate (first substrate) 8 by ejecting liquid trimethylaluminum by an ink-jet method in a nitrogen gas atmosphere. The droplets 5 were placed at the positions corresponding to all openings 31 of the monolayer pattern 30a formed on the second substrate 7.

Next, the second substrate 7 was placed parallel to and above the first substrate 8 with a predetermined distance (e.g., 1 mm) therebetween so that the surface 71 to form the thin film provided with the monolayer pattern 30a faced downward. At this stage, the two substrates 7 and 8 are opposed to each other so that the openings 31 of the monolayer pattern 30a formed on the second substrate 7 and the positions of the droplets 5 on the first substrate 8 match completely. For that purpose, for example, alignment marks may be formed on both substrates, and by fitting the marks together, the openings 31 are aligned with the positions of the droplets 5. FIG. 4(a) shows such a state.

Figure 4:
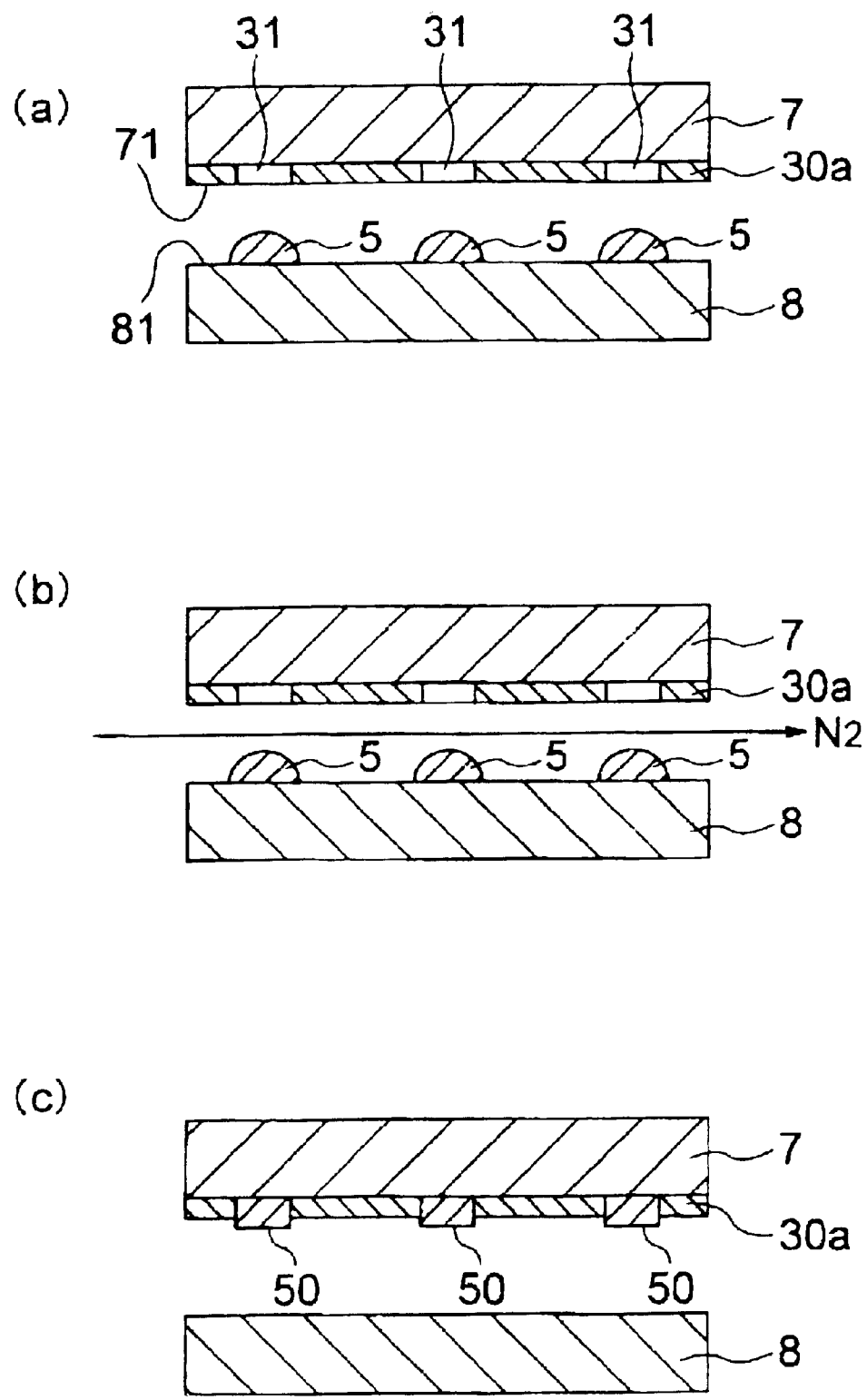
FIGS. 4(a)–4(c) are schematics illustrating a method in the third embodiment of the present invention.

Next, as shown in FIG. 4(b), in this state, the second substrate 7 was heated to 300° C. and retained for 5 minutes, while supplying nitrogen gas between the substrates 7 and 8 parallel to the substrate surfaces. Thereby, the first substrate 8 was indirectly heated by the heat radiated from the second substrate 7, the droplets 5 formed of trimethylaluminum on the first substrate 8 were vaporized, and the gas was fed into the openings 31 of the monolayer pattern 30a formed on the second substrate 7.

As a result, the gaseous trimethylaluninum was decomposed by heat, and aluminum was deposited in the openings 31 of the monolayer pattern 30a of the second substrate 7. As shown in FIG. 4(c), an aluminum thin film 50 was formed in the respective openings 31. The aluminum thin film 50 was not formed on the surface of the monolayer-remaining section of the monolayer pattern 30a. The aluminum thin film 50 had a thickness of 20 nm.

As described above, in accordance with the methods of the first to third embodiments, by partially placing a liquid raw material for a thin film on a substrate and vaporizing it, it is possible to form a thin film pattern more easily by CVD using a small amount of the raw material for the thin film. Therefore, in such methods, a large-scale exhaust unit or neutralization unit is not required. Furthermore, since the placement of the liquid is performed by an ink-jet method, the liquid can be arrayed easily and accurately.

In particular, in accordance with the methods of the second and third embodiments, since the monolayer pattern 30a is formed on the surface to form the thin film before the liquid raw material to form the thin film is placed so that the thin film is selectively grown in the openings 31 of the monolayer pattern 30a, the thin film pattern can be obtained simultaneously with the formation of the thin film. Therefore, a patterning step is not required after the formation of the thin film.

In accordance with the method of the third embodiment, by placing two substrates 7 and 8 so as to face each other, and sending the vaporized substance from the individual droplets 5 to the individual openings 31 of the monolayer pattern 30a, higher uniformity of the film thickness in each opening 31 and higher uniformity of the film thickness among a plurality of openings 31 can be achieved in comparison with the method of the second embodiment.

Furthermore, in accordance with the method of the third embodiment, since only the second substrate 7 is directly heated, and the first substrate 8 is indirectly heated by the heat radiated from the second substrate 7, the cost associated with heating can be reduced.

Additionally, in the third embodiment, by forming the same monolayer pattern 30a on each of the first substrate 8 and the second substrate 7 and placing the droplets 5 in the individual openings 31, the amount of the raw material used can be decreased.

The thin films formed of aluminum thus produced may be used as electrodes. For example, as electrodes for display provided in a display device, the thin films formed of aluminum as described above may be used. Additionally, by decreasing the width of wiring, the thin films may be used as wiring formed in a display devices.

Figure 5:
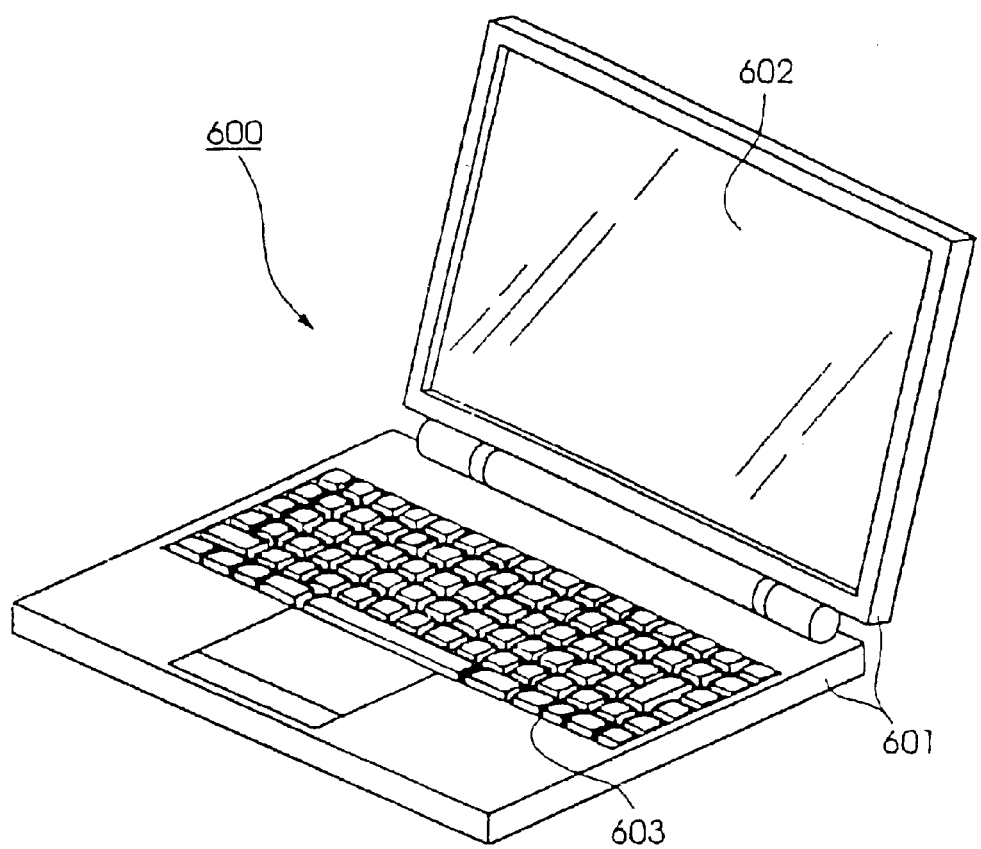
FIG. 5 is a schematic perspective view of an electronic apparatus to which the present invention is applied.

By using the display device thus fabricated, for example, a notebook-size personal computer 600 (electronic apparatus) shown in FIG. 5 may be produced. FIG. 5 is a schematic perspective view showing an example of electronic apparatus provided with display devices in accordance with an embodiment of the present invention. Additionally, in FIG. 5, numeral 601 represents a casing, numeral 602 represents a liquid crystal display device, and numeral 603 represents a keyboard. With respect to the display device, although the liquid crystal display device is shown as an example, an organic EL device may also be used, and the present invention is also applicable to a plasma display.

Figure 6:
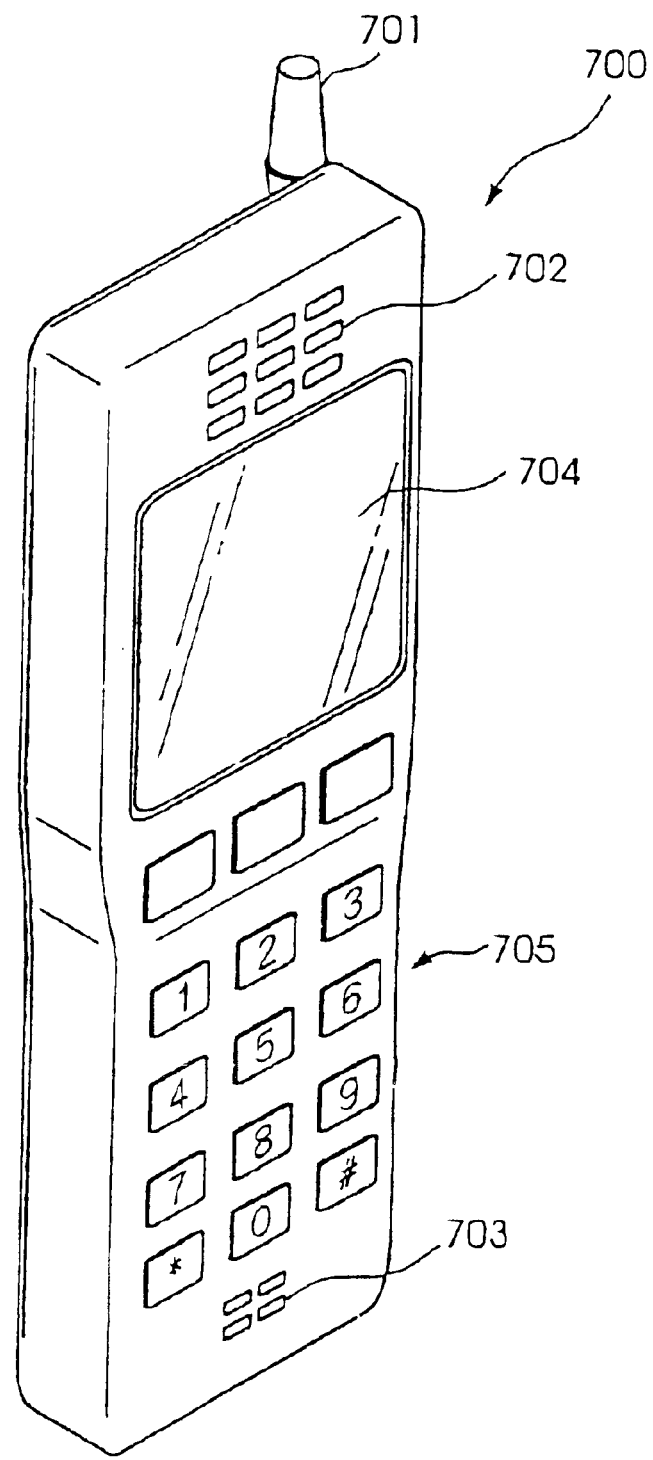
FIG. 6 is a schematic perspective view of another electronic apparatus to which the present invention is applied.

FIG. 6 is a perspective view showing a mobile telephone as another electronic apparatus. A mobile telephone 700 shown in FIG. 6 includes an antenna 701, a receiver 702, a transmitter 703, a liquid crystal display device 704, and an operation button section 705. Although the liquid crystal display device is also shown as an example of display devices, as described above, with respect to the display device, an organic EL device may also be used.

In the embodiments described above, the notebook-size computer and mobile telephone have been described as examples of electronic apparatus. However, the present invention is not limited thereto, and the thin films are also applicable to any other electronic apparatus, such as liquid crystal projectors, multimedia personal computers (PC) and engineering workstations (EWS), pagers, word processors, televisions, viewfinder type or monitor-direct-view type video tape recorders, electronic pocket diaries, electronic desk calculators, car navigation apparatus, POS terminals, and apparatus provided with touch panels, for example.

As described above, in accordance with the method of the present invention, in methods for forming thin films using CVD, a large-scale vacuum exhaust unit or neutralization unit is not required, and it is possible to form a thin film pattern using a small amount of liquid raw material.

What is claimed is:

1. A method for forming a thin film by chemical vapor deposition, comprising the steps of:

placing a liquid containing a raw material for the thin film over one of a part and a plurality of parts of a substrate;

vaporizing the raw material for the thin film from the liquid so as to be fed to one of a part and a plurality of parts of a surface to form the thin film so as to form the thin film with a predetermined pattern over the surface to form the thin film; and using a surface of the substrate as a surface to place the liquid, and forming the thin film in a region other than the region in which the liquid is placed on the surface to place the liquid.

2. A method for forming a thin film by chemical vapor deposition comprising:

placing a liquid containing a raw material for the thin film over one of a part or a plurality of parts of a substrate;

vaporizing the raw material for the thin film from the liquid so as to be fed to one of a part or a plurality of parts of a surface to form the thin film so as to form the thin film with a predetermined pattern over the surface to form the thin film;

using a surface of the substrate as a surface to place the liquid, and forming the thin film in a region other than the region in which the liquid is placed on the surface to place the liquid; and performing an formation of the active region and an inactive region for the chemical vapor deposition by forming a self-assembled film on the surface to form the thin film having hydroxyl groups using a silane derivative represented by a general formula $RSiX_3$ (wherein R is a fluoroalkyl group in which terminal hydrogen of the alkyl group is replaced with fluorine, and X is an alkoxy group or halogen group); and performing ultraviolet irradiation on the self-assembled film through a photomask or performing electron beam irradiation on necessary parts of the self-assembled film so that the self-assembled film in a region to form the active region for the chemical vapor deposition is removed.

3. A method for forming a thin film by chemical vapor deposition comprising:

placing a liquid containing a raw material for the thin film over one of a part or a plurality of parts of a substrate;

vaporizing the raw material for the thin film from the liquid so as to be fed to one of a part or a plurality of parts of a surface to form the thin film so as to form the thin film with a predetermined pattern over the surface to form the thin film; and wherein the step of placing the liquid is performed by an ink-jet method.

4. A method for forming a thin film according to claim 3, further comprising using a surface of the substrate as a surface to place the liquid, and forming the thin film in a region other than the region in which the liquid is placed on the surface to place the liquid.

5. The method for forming a thin film according to claim 3, further comprising placing a first substrate to place the liquid and a second substrate to form the thin film so that the surface to place the liquid of the first substrate faces the surface to form the thin film of the second substrate, and vaporizing the raw material for the thin film from the liquid placed on one of a part and a plurality of parts of the first substrate so as to be fed to the surface to form the thin film of the second substrate.

6. The method for forming a thin film according to claim 5, further comprising heating the surface to form the thin film of the second substrate to a temperature at which a vaporized substance of the raw material for the thin film is decomposable, and heating the first substrate to a temperature at which the raw material for the thin film is vaporized from the liquid by the heat radiated from the second substrate.

7. The method for forming a thin film according to claim 3, further comprising, before the step of placing the liquid, forming an active region and an inactive region for the chemical vapor deposition in the surface to form the thin film so that the thin film is selectively deposited.

8. The method for forming a thin film according to claim 7, further comprising performing the formation of the active region and the inactive region for the chemical vapor deposition by forming a self-assembled film on the surface to form the thin film having hydroxyl groups using a silane derivative represented by a general formula $RSiX_3$ (Wherein R is a fluoroalkyl group in which terminal hydrogen of the alkyl group is replaced with fluorine, and X is an alkoxy group or halogen group); and performing ultraviolet irradiation on the self-assembled film through a photomask or performing electron beam irradiation on necessary parts of the self-assembled film so that the self-assembled film in a region to form the active region for the chemical vapor deposition is removed.

9. The method for forming a thin film according to claim 3, further comprising performing the step of vaporizing the raw material for the thin film while supplying inert gas, hydrogen gas, or a mixture of inert gas and hydrogen gas parallel to the surface to place the liquid of the substrate.

* * * * *